(12) United States Patent
Yang et al.

(10) Patent No.: US 10,015,482 B2
(45) Date of Patent: Jul. 3, 2018

(54) IMAGE SENSOR HAVING TEST PATTERN AND OFFSET CORRECTION METHOD THEREOF

(71) Applicant: SK hynix Inc., Gyeonggi-do (KR)

(72) Inventors: Yun-Hui Yang, Chungcheongbuk-do (KR); Donghyun Woo, Seoul (KR); Jong-Chae Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/454,531

(22) Filed: Mar. 9, 2017

(65) Prior Publication Data

US 2018/0035107 A1 Feb. 1, 2018

(30) Foreign Application Priority Data

Jul. 29, 2016 (KR) .......................... 10-2016-0097260

(51) Int. Cl.
*H04N 17/00* (2006.01)

(52) U.S. Cl.
CPC ............................... *H04N 17/002* (2013.01)

(58) Field of Classification Search
CPC ..................................................... H04N 17/002
USPC .......................... 348/188, 187, 180, 175, 189
See application file for complete search history.

(56) References Cited

U.S. PATENT DOCUMENTS

2016/0345005 A1* 11/2016 Hoekstra .............. H04N 5/3592

* cited by examiner

*Primary Examiner* — Michael Lee
*Assistant Examiner* — Jean W Desir
(74) *Attorney, Agent, or Firm* — IP & T Group LLP

(57) ABSTRACT

An image sensor includes a substrate including an active pixel and a test pattern, wherein the test pattern is located adjacent to the active pixel, wherein the active pixel comprises a first photodiode, a floating diffusion, a first channel provided between the first photodiode and the floating diffusion, and a first transfer gate electrode provided over the first channel, wherein the test pattern comprises a first test photodiode, a test floating diffusion, a second channel provided between the first test photodiode and the test floating diffusion, a first test transfer gate electrode provided over the second channel, and a first contact plug connected to the first test photodiode, and wherein the first test photodiode, the test floating diffusion, the second channel, and the first test transfer gate have substantially the same alignment errors as the first photodiode, the floating diffusion, the first channel, and the first transfer gate electrode, respectively.

16 Claims, 8 Drawing Sheets

IMAGE SENSOR HAVING TEST PATTERN AND OFFSET CORRECTION METHOD THEREOF

CROSS-REFERENCE TO RELATED APPLICATIONS

The present application claims priority to Korean Patent Application No. 10-2016-0097260, filed on Jul. 29, 2016, which is herein incorporated by reference in its entirety.

BACKGROUND

1. Field

Exemplary embodiments of the present invention relate to a semiconductor device fabrication technology, and more particularly, to an image sensor having a test pattern for correcting an offset between pixels therein and an offset correction method thereof.

2. Description of the Related Art

An image sensor is a device which converts an optical image into an electrical signal. Recently, with the development of the computer industry and the communication industry, the demand for an enhanced image sensor has increased in various devices such as a digital camera, camcorder, Personal Communication System (PCS), game machine, security camera, medical micro-camera and a robot.

SUMMARY

Various embodiments are directed to an image sensor having a test pattern for correcting an offset between pixels therein and an offset correction method thereof.

In an embodiment, an image sensor may include: a substrate including an active pixel and a test pattern, wherein the test pattern is located adjacent to the active pixel, wherein the active pixel comprises a first photodiode, a floating diffusion, a first channel provided between the first photodiode and the floating diffusion, and a first transfer gate electrode provided over the first channel, wherein the test pattern comprises a first test photodiode, a test floating diffusion, a second channel provided between the first test photodiode and the test floating diffusion, a first test transfer gate electrode provided over the second channel, and a first contact plug connected to the first test photodiode, and wherein the first test photodiode, the test floating diffusion, the second channel, and the first test transfer gate have substantially the same alignment errors as the first photodiode, the floating diffusion, the first channel, and the first transfer gate electrode, respectively.

The image sensor may further include: a logic circuit adjacent to the active pixel; and a correction circuit formed in the logic circuit, wherein the correction circuit is connected to the first transfer gate electrode. The test pattern may be formed between the logic circuit and the active pixel. The test pattern may be connected to a side surface of the active pixel.

The first test photodiode, the test floating diffusion, the second channel, and the first test transfer gate electrode, in combination, form a test transfer transistor, wherein the correction circuit may include a storage unit and a compensation unit, wherein the storage unit stores an electrical characteristic of the test transfer transistor, a correction bias calculated based on the electrical characteristic, or both; and wherein the compensation unit is connected to the storage unit and provides the correction bias to the first transfer gate electrode. The correction circuit may further include: a calculation unit connected to the storage unit and processing the electrical characteristic of the test transfer transistor. The correction circuit may further include: a comparison unit connected between the storage unit and the compensation unit and calculates the correction bias by comparing the electrical characteristic with a reference bias. The storage unit may include a nonvolatile memory.

The active pixel may further include a second photodiode, a third channel provided between the second photodiode and the floating diffusion, and a second transfer gate electrode provided over the third channel, wherein the floating diffusion is arranged between the first photodiode and the second photodiode, wherein the test pattern region further comprises a second test photodiode, a fourth channel provided between the second test photodiode and the test floating diffusion, a second test transfer gate electrode provided over the fourth channel, and a second contact plug connected to the second test photodiode, wherein the test floating diffusion is arranged between the first test photodiode and the second test photodiode, and wherein the second test photodiode, the fourth channel, and the second test transfer gate electrode have substantially the same alignment errors as the second photodiode, the third channel, and the second transfer gate electrode, respectively. The first channel has a first length, the second channel has a second length, the third channel has a third length, and the fourth channel has a fourth length, wherein the second length of the second channel may be substantially equal to the first length of the first channel, and wherein the fourth length of the fourth channel may be substantially equal to the third length of the third channel. The third length of the third channel may be smaller than the first length of the first channel.

The image sensor may further include: a third contact plug connected to the test floating diffusion. The first test photodiode, the second test photodiode, the test floating diffusion, the second channel, the fourth channel, the first test transfer gate electrode, and the second test transfer gate electrode comprise the same materials as the first photodiode, the second photodiode, the floating diffusion, the first channel, the third channel, the first transfer gate electrode, and the second transfer gate electrode, respectively.

In an embodiment, there is provided an offset correction method of an image sensor having an active pixel region and a test pattern region, each of which includes a plurality of unit pixel groups arranged in a two-dimensional manner, the unit pixel groups each including a plurality of pixels sharing one floating diffusion. The offset correction method may include: measuring electrical characteristics of test transfer transistors in the test pattern region; processing electrical characteristics of test transfer transistors formed at first positions in the unit pixel groups of the test pattern region; calculating correction values by comparing the processed electrical characteristics to reference characteristics of transfer transistors formed at second positions in the unit pixel groups of the active pixel region; and correcting offsets for the transfer transistors formed at the second positions in the unit pixel groups of the active pixel region based on the calculated correction value.

The first position and the second position in each of the unit pixel groups may be the same positions. The active pixel region may include a first channel between a first photodiode and a floating diffusion, and a first transfer gate electrode over the first channel, the test pattern region may include a second channel between a first test photodiode and a test floating diffusion, a first test transfer gate electrode over the second channel, and a first contact plug connected to the first test photodiode, and the first test photodiode, the test floating diffusion, the second channel and the first test transfer gate electrode may have substantially the same alignment errors as the first photodiode, the floating diffusion, the first channel and the first transfer gate electrodes.

DETAILED DESCRIPTION

Figure 1:
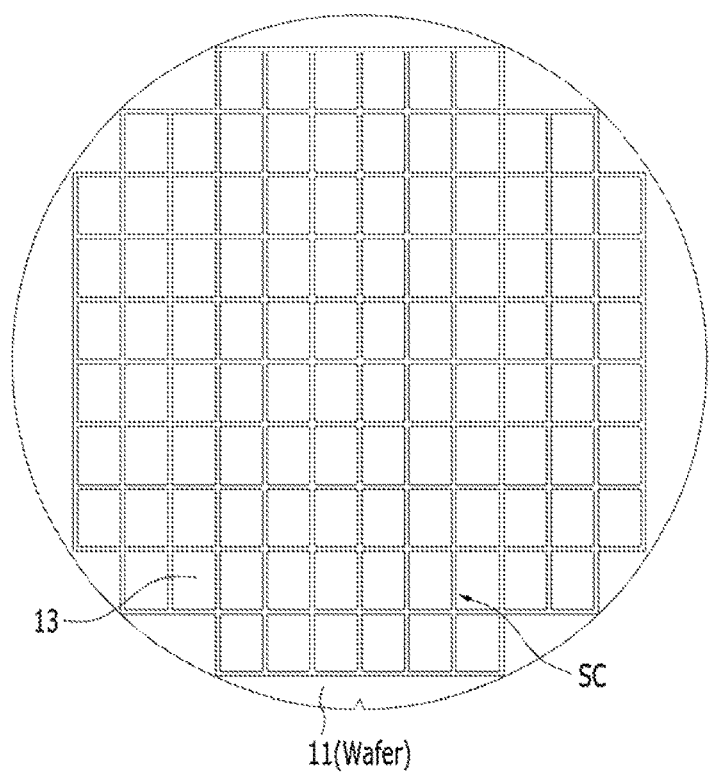
FIGS. 1 to 3 are layout diagrams for describing an image sensor in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terms used in this specification are used only for describing exemplary embodiments while not limiting the present invention. The terms of a singular form may include plural forms unless referred to the contrary. The meaning of 'comprise' or 'comprising' used in the specification specifies a component, a step, an operation, and/or an element, but does not exclude other components, steps, operations, and/or elements.

When one element is referred to as being "connected to" or "coupled to" another element, it may indicate that the former element is directly connected or coupled to the latter element or another element is interposed therebetween. Moreover, when one element is referred to as being "directly connected to" or "directly coupled to" another element, it may indicate that no element is interposed therebetween. Furthermore, "and/or" includes each of the described items and one or more combinations of the items.

The terms such as 'below', 'beneath', 'lower', 'above' and 'upper', which are spatially relative terms, may be used to describe the correlation between one element or components and another element or other components as illustrated in the drawings. A spatially relative term should be understood as a term including different directions of an element when the element is used or operated, in addition to the direction illustrated in the drawings. For example, when an element illustrated in a drawing is turned over, the element which is referred to as being 'below' or 'beneath' another element may be placed above another element.

Moreover, embodiments included in this specification will be described with reference to cross-sectional views and/or plane views as ideal exemplary views of the present invention. In the drawings, the dimensions of layers and regions may be exaggerated for clarity of illustration. Accordingly, the shapes of the exemplary views may be modified according to fabrication techniques and/or allowable errors. Therefore, the present embodiments are not limited to the specific shapes illustrated in the exemplary views, but may include other shapes that may be created according to fabrication processes. For example, a region illustrated as angular may have a rounded shape or a certain radius of curvature. Regions exemplified in the drawings have general properties, and the shapes of the regions are used to illustrate specific shapes of elements. Thus, this should not be construed as limited to the scope of the present invention.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

In the present specification, source electrodes and drain electrodes of transistors may be compatible with each other. Since transistors described in this specification are Field Effect Transistors (FETs) such MOS transistors, the source electrodes and the drain electrodes may be symmetric and compatible with each other. Therefore, in a variety of embodiments, a source electrode may be analyzed as a drain electrode, and a drain electrode may be analyzed as a source electrode.

The following embodiments provide a test pattern for correcting an offset between pixels in an image sensor and an offset correction method using the same. The offset between pixels may indicate that transfer transistors included in a plurality of pixels, respectively, are not uniformly formed due to an error of the fabrication process, or variations of the transfer transistors. Hereafter, embodiments will be described in detail with reference to the accompanying drawings.

Figure 2:
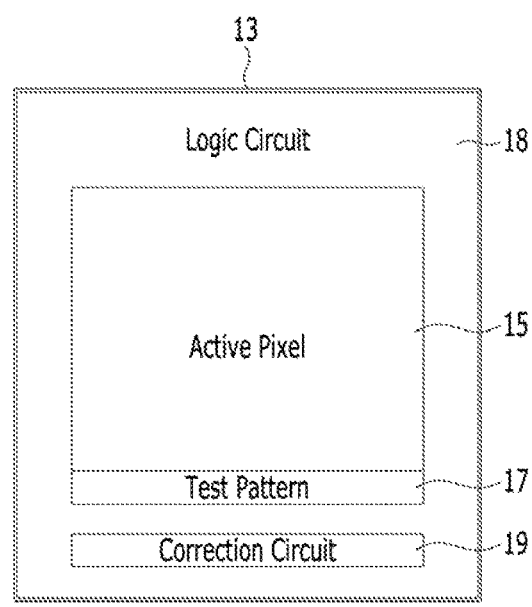
Figure 3:
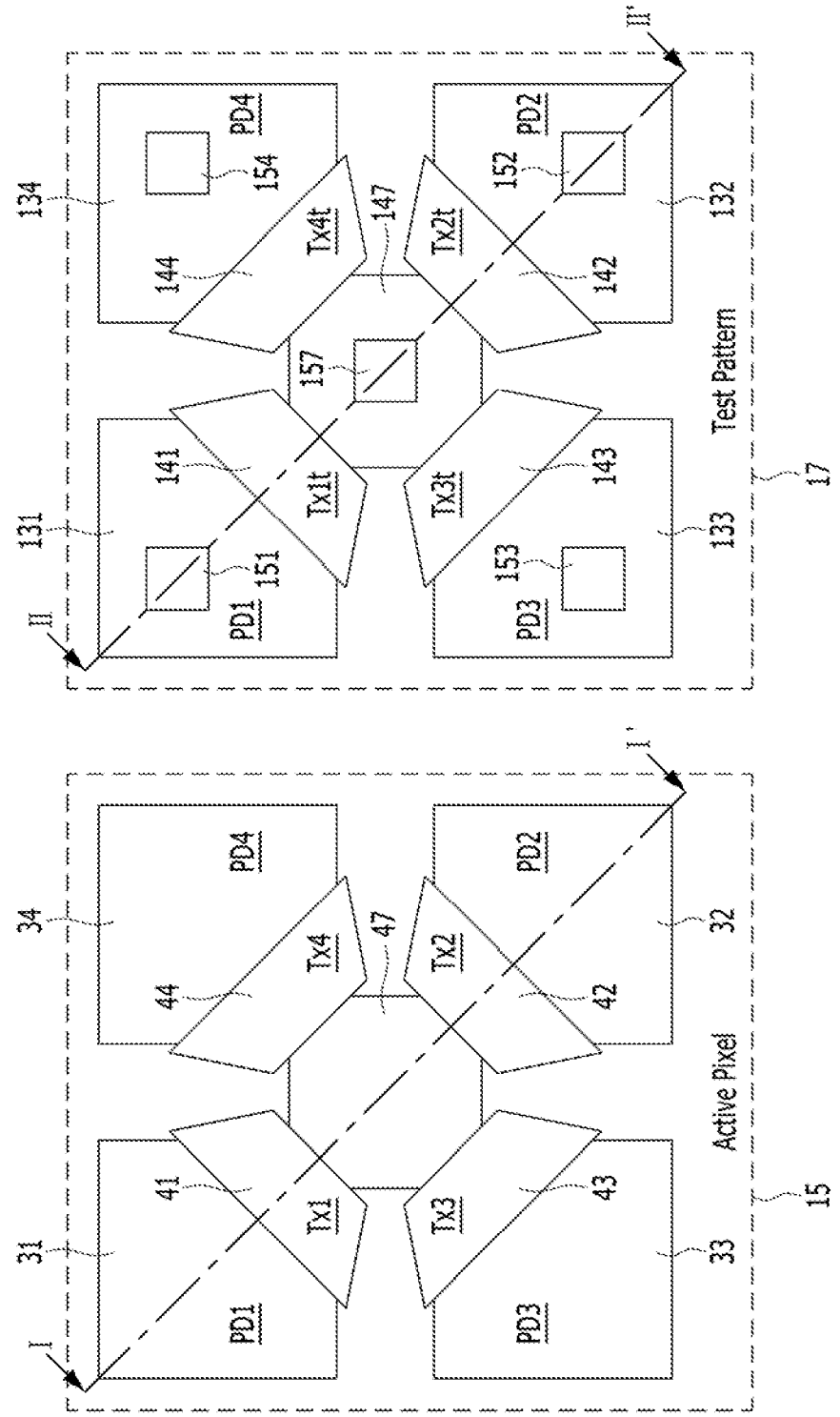

FIGS. 1 to 3 are layout diagrams for describing an image sensor in accordance with an embodiment. Referring to FIG. 1, a plurality of chips 13 and scribe lanes SC may be formed on a substrate 11. The substrate 11 may include a semiconductor substrate such as a silicon wafer. For example, the substrate 11 may include single crystal silicon containing P-type impurities. The plurality of chips 13 may be two-dimensionally arranged in or over the substrate 11. The respective chips 13 may be separated from each other by the scribe lanes SC.

Referring to FIG. 2, the chip 13 may include an active pixel region 15, a test pattern region 17, a logic circuit region 18 and a correction circuit 19. FIG. 2 illustrates a part of FIG. 1 in detail.

The logic circuit region 18 may be formed to surround the active pixel region 15. The test pattern region 17 may be formed adjacent to a side of the active pixel region 15. The test pattern region 17 may be formed between the active pixel region 15 and the logic circuit region 18. The correction circuit 19 may be formed in the logic circuit region 18. The active pixel region 15 and the test pattern region 17 may be formed on the same wafer. The logic circuit region 18 and the correction circuit 19 may be formed on a wafer different from the wafer where the active pixel region 15 and the test pattern region 17 are formed. Furthermore, the respective elements may be vertically stacked.

In an embodiment, the test pattern region 17 may be connected to a side surface of the active pixel region 15. The test pattern region 17 may be connected to an edge of the active pixel region 15. The test pattern region 17 may be directly contacted with the side surface of the active pixel region 15.

In accordance with the present embodiment, the test pattern region 17 may be formed at a position adjacent to the active pixel region 15. The test pattern region 17 may include test transfer transistors for example, Tx1t and Tx2t of FIG. 6, which exhibit substantially the same structure and electrical characteristic as transfer transistors of the active pixel region 15 for example, Tx1 and Tx2 of FIG. 6. Due to the same structure, the test pattern region 17 may have substantially the same alignment error as the active pixel region 15. The accuracy of correction biases for example, Vp1 and Vp2 of FIG. 6, which are calculated based on the electrical characteristics measured through the test transfer transistors for example, Tx1t and Tx2t of FIG. 6, may be more excellent than in the related art. Thus, the electrical characteristics of the transfer transistors for example, Tx1 and Tx2 of FIG. 6 may be optimized, which makes it possible to implement an image sensor having satisfactory electrical characteristics.

In an embodiment, the test pattern region 17 may be formed at various positions near the active pixel region 15 in the chip 13. For example, the test pattern region 17 may be formed adjacent to two side surfaces of the active pixel region 15 or formed to surround four surfaces of the active pixel region 15.

FIG. 3 illustrates an image sensor in accordance with the present embodiment which has a 4-shared pixel structure. Referring to FIG. 3, the active pixel region 15 may include a first photodiode 31, a second photodiode 32, a third photodiode 33, a fourth photodiode 34, a first transfer gate electrode 41, a second transfer gate electrode 42, a third transfer gate electrode 43, a fourth transfer gate electrode 44 and a floating diffusion 47. The test pattern region 17 may include a first test photodiode 131, a second test photodiode 132, a third test photodiode 133, a fourth test photodiode 134, a first test transfer gate electrode 141, a second test transfer gate electrode 142, a third test transfer gate electrode 143, a fourth test transfer gate electrode 144, a test floating diffusion 147, a first contact plug 151, a second contact plug 152, a third contact plug 153, a fourth contact plug 154 and a fifth contact plug 157.

The first photodiode 31, the second photodiode 32, the third photodiode 33 and the fourth photodiode 34 may be separated from one another. The floating diffusion 47 may be surrounded by the first photodiode 31, the second photodiode 32, the third photodiode 33 and the fourth photodiode 34. The first photodiode 31 may be formed adjacent to the third and fourth photodiodes 33 and 34, while facing the second photodiode 32. The third photodiode 33 may be formed adjacent to the first and second photodiodes 31 and 32, while facing the fourth photodiode 34.

The first transfer gate electrode 41 may be formed between the floating diffusion 47 and the first photodiode 31. The second transfer gate electrode 42 may be formed between the floating diffusion 47 and the second photodiode 32. The third transfer gate electrode 43 may be formed between the floating diffusion 47 and the third photodiode 33. The fourth transfer gate electrode 44 may be formed between the floating diffusion 47 and the fourth photodiode 34.

The first photodiode 31, the second photodiode 32, the third photodiode 33 and the fourth photodiode 34 may share the floating diffusion 47. For example, the first photodiode 31, the second photodiode 32, the third photodiode 33 and the fourth photodiode 34 may correspond to colors, Gr, Gb, B and R, respectively.

The plurality of 4-shared pixel structures may be repetitively arranged in the row and column directions within the active pixel region 15. The plurality of photodiodes 31 to 34, the plurality of transfer gate electrodes 41 to 44 and the plurality of floating diffusions 47 may be repetitively arranged in the row and column directions within the active pixel region 15.

The first to fourth test photodiodes 131 to 134, the first to fourth test transfer gate electrodes 141 to 144, and the test floating diffusion 147 may correspond to the first to fourth photodiodes 31 to 34, the first to fourth transfer gate electrodes 41 to 44, and the floating diffusion 47, respectively. The first to fourth test photodiodes 131 to 134, the first to fourth test transfer gate electrodes 141 to 144, and the test floating diffusion 147 may be formed substantially at the same time as the first to fourth photodiodes 31 to 34, the first to fourth transfer gate electrodes 41 to 44, and the floating diffusion 47, and include substantially the same materials and structures as the first to fourth photodiodes 31 to 34, the first to fourth transfer gate electrodes 41 to 44, and the floating diffusion 47, respectively.

The first contact plug 151 may be connected to the first test photodiode 131. The second contact plug 152 may be connected to the second test photodiode 132. The third contact plug 153 may be connected to the third test photodiode 133. The fourth contact plug 154 may be connected to the fourth test photodiode 134. The fifth contact plug 157 may be connected to the test floating diffusion 147.

The first test photodiode 131, the second test photodiode 132, the third test photodiode 133 and the fourth test photodiode 134 may be separated from one another. The test floating diffusion 147 may be surrounded by the first test photodiode 131, the second test photodiode 132, the third test photodiode 133 and the fourth test photodiode 134. The first test photodiode 131 may be formed adjacent to the third and fourth test photodiodes 133 and 134, while facing the second test photodiode 132. The third test photodiode 133 may be formed adjacent to the first and second test photodiodes 131 and 132, while facing the fourth test photodiode 134.

The first test transfer gate electrode 141 may be formed between the test floating diffusion 147 and the first test photodiode 131. The second test transfer gate electrode 142 may be formed between the test floating diffusion 147 and the second test photodiode 132. The third test transfer gate electrode 143 may be formed between the test floating diffusion 147 and the third test photodiode 133. The fourth test transfer gate electrode 144 may be formed between the test floating diffusion 147 and the fourth test photodiode 134. The first test photodiode 131, the second test photodiode 132, the third test photodiode 133 and the fourth test photodiode 134 may share the test floating diffusion 147.

The plurality of test photodiodes 131 to 134, the plurality of test transfer gate electrodes 141 to 144, the plurality of test floating diffusion s147 and the plurality of contact plugs 151 to 154 and 157 may be repetitively arranged in the test pattern region 17. For example, 20 or more test photodiodes 131 to 134, 20 or more test transfer gate electrodes 141 to 144, 20 or more test floating diffusions 147 and 20 or more contact plugs 151 to 154 and 157 may be repetitively formed in the test pattern region 17. In an embodiment, the first to fourth transfer gate electrodes 41 to 44 and the first to fourth test transfer gate electrodes 141 to 144 may have various sizes and shapes.

Although the image sensor in accordance with the present embodiment has the 4-shared pixel structure, an image sensor in accordance with another embodiment may include a 2-shared pixel structure, a 3-shared pixel structure, a 4-shared pixel structure, an 8-shared pixel structure, an N-shared pixel structure, or a combination thereof.

Figure 4:
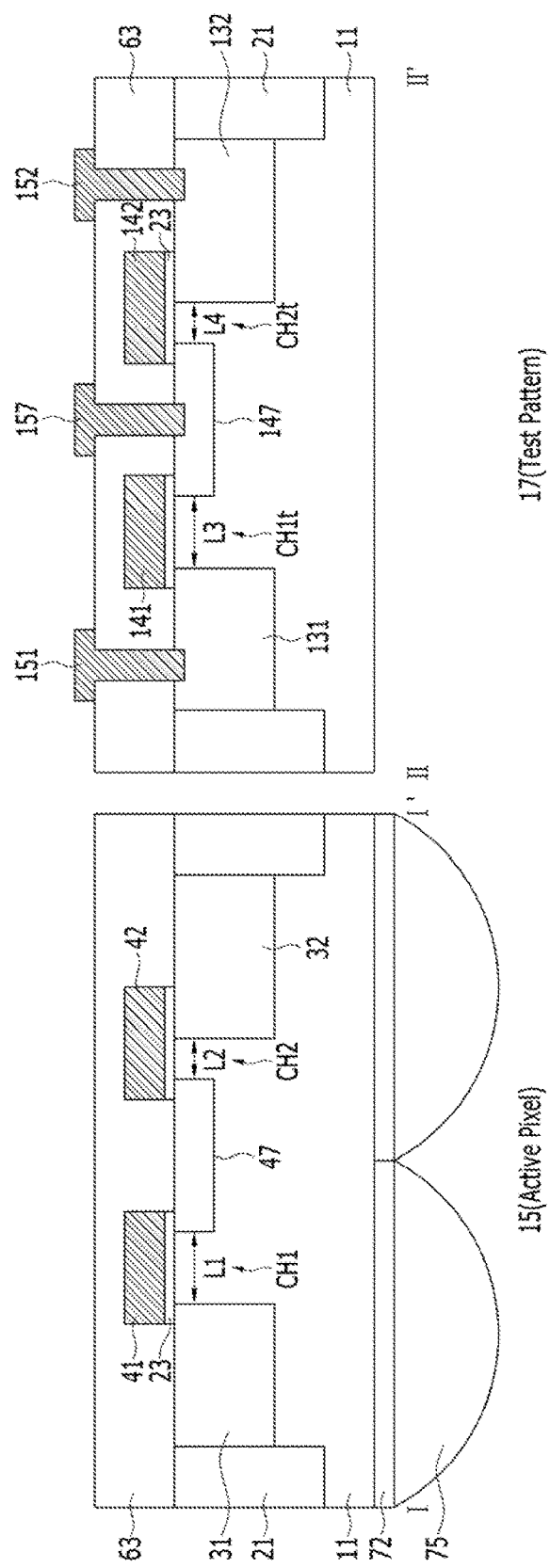
FIGS. 4 and 5 are cross-sectional views for describing main components of the image sensor in accordance with the embodiment.
Figure 5:
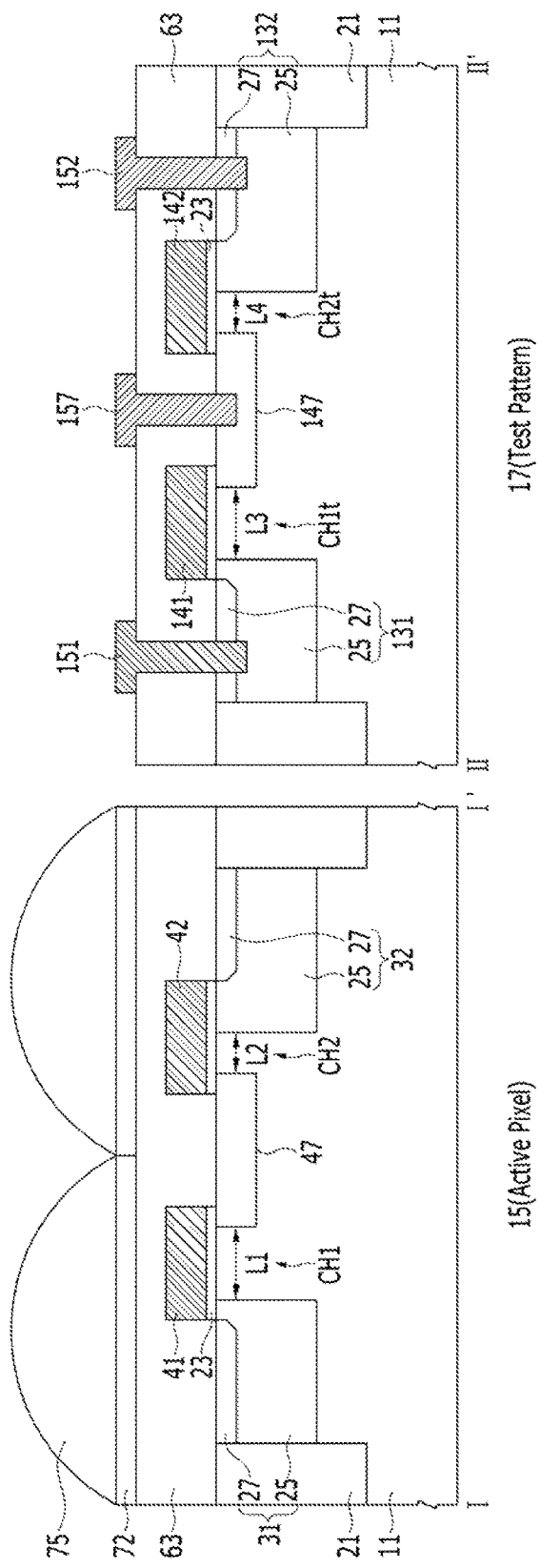

FIGS. 4 and 5 are cross-sectional views taken along the lines I-I' and II-II' of FIG. 3, respectively. Referring to FIG. 4, the active pixel region 15 may include a substrate 11, an isolation layer 21, a gate dielectric layer 23, the first photodiode 31, the second photodiode 32, the first transfer gate electrode 41, the second transfer gate electrode 42, the floating diffusion 47, a first insulating layer 63, a color filter layer 72 and a microlens layer 75.

The substrate 11 may have first and second channels CH1 and CH2 defined therein. The first channel CH1 may have a first length L1, and the second channel CH2 may have a second length L2. The first photodiode 31, the second photodiode 32, the floating diffusion 47, the first channel CH1, and the second channel CH2 may be defined in the substrate 11 by the isolation layer 21.

The floating diffusion 47 may be formed between the first and second photodiodes 31 and 32. The first channel CH1 may be formed between the floating diffusion 47 and the first photodiode 31. The second channel CH2 may be formed between the floating diffusion 47 and the second photodiode 32. The first transfer gate electrode 41 may be formed over the first channel CH1. The second transfer gate electrode 42 may be formed over the second channel CH2. The gate dielectric layer 23 may be interposed between the first transfer gate electrode 41 and the first channel CH1 and between the second transfer gate electrode 42 and the second channel CH2.

An alignment error may occur among the first photodiode 31, the second photodiode 32, the first transfer gate electrode 41, the second transfer gate electrode 42, the floating diffusion 47, the first channel CH1 and the second channel CH2. The first photodiode 31, the second photodiode 32, the first transfer gate electrode 41, the second transfer gate electrode 42, the floating diffusion 47, the first channel CH1 and the second channel CH2 may be misaligned by an alignment error occurring in a lithography process. For example, the first length L1 of the first channel CH1 may be different from the second length L2 of the second channel CH2. For example, the second length L2 may be smaller than the first length L1.

The first insulating layer 63 may cover an upper surface of the substrate 11. The first insulating layer 63 may cover the isolation layer 21, the first photodiode 31, the second photodiode 32, the first transfer gate electrode 41, the second transfer gate electrode 42, and the floating diffusion 47.

The color filter layer 72 may be formed on a rear surface of the substrate 11. The microlens layer 75 may be formed on the color filter layer 72. The color filter layer 72 may be arranged between the microlens layer 75 and the first photodiode 31 and between the microlens layer 75 and the second photodiode 32. The color filter layer 72 may include colors, Gr, Gb, B and R.

The image sensor in accordance with the present embodiment may be characterized as a Back Side Illumination (BSI) image sensor. The substrate 11 containing P-type impurities may be interposed between the microlens layer 75 and the first photodiode 31 and between the microlens layer 75 and the second photodiode 32. The first and second photodiodes 31 and 32 may directly contact the substrate 11 containing P-type impurities.

The test pattern region 17 may include the substrate 11, the isolation layer 21, the gate dielectric layer 23, the first test photodiode 131, the second test photodiode 132, the first test transfer gate electrode 141, the second test transfer gate electrode 142, the test floating diffusion 147, the first contact plug 151, the second contact plug 152, the fifth contact plug 157 and the first insulating layer 63. The substrate 11 may have first and second test channels CH1$t$ and CH2$t$ defined therein. The first test channel CH1$t$ may have a third length L3, and the second test channel CH2$t$ may have a fourth length L4.

The first test photodiode 131, the second test photodiode 132, the first test transfer gate electrode 141, the second test transfer gate electrode 142, the test floating diffusion 147, the first test channel CH1$t$ and the second test channel CH2$t$ may correspond to the first photodiode 31, the second photodiode 32, the first transfer gate electrode 41, the second transfer gate electrode 42, the floating diffusion 47, the first channel CH1 and the second channel CH2, respectively. The first test photodiode 131, the second test photodiode 132, the first test transfer gate electrode 141, the second test transfer gate electrode 142, the test floating diffusion 147, the first test channel CH1$t$ and the second test channel CH2$t$ may be formed substantially at the same time as the first photodiode 31, the second photodiode 32, the first transfer gate electrode 41, the second transfer gate electrode 42, the floating diffusion 47, the first channel CH1 and the second channel CH2, and include substantially the same materials and structures as the first photodiode 31, the second photodiode 32, the first transfer gate electrode 41, the second transfer gate electrode 42, the floating diffusion 47, the first channel CH1 and the second channel CH2, respectively.

The first test photodiode 131, the second test photodiode 132, the first test transfer gate electrode 141, the second test transfer gate electrode 142, the test floating diffusion 147, the first test channel CH1$t$ and the second test channel CH2$t$ may include substantially the same alignment errors as the first photodiode 31, the second photodiode 32, the first transfer gate electrode 41, the second transfer gate electrode 42, the floating diffusion 47, the first channel CH1 and the second channel CH2, respectively. For example, the first test photodiode 131, the second test photodiode 132, the first test transfer gate electrode 141, the second test transfer gate electrode 142, the test floating diffusion 147, the first test channel CH1$t$ and the second test channel CH2$t$ may be misaligned during a lithography process by as much as the first photodiode 31, the second photodiode 32, the first transfer gate electrode 41, the second transfer gate electrode 42, the floating diffusion 47, the first channel CH1 and the second channel CH2, respectively.

The third length L3 of the first test channel CH1$t$ may be different from the fourth length L4 of the second test channel CH2$t$. For example, the fourth length L4 may be smaller than the third length L3. The third length L3 may be substantially equal to the first length L1, and the fourth length L4 may be substantially equal to the second length L2. The first test photodiode 131, the second test photodiode 132, the test floating diffusion 147, the first test channel CH1$t$ and the second test channel CH2$t$ may be defined in the substrate 11 by the isolation layer 21.

The test floating diffusion 147 may be formed between the first and second test photodiodes 131 and 132. The first test channel CH1$t$ may be formed between the test floating diffusion 147 and the first test photodiode 131. The second test channel CH2t may be formed between the test floating diffusion 147 and the second test photodiode 132. The first test transfer gate electrode 141 may be formed over the first test channel CH1t. The second test transfer gate electrode 142 may be formed over the second test channel CH2t. The gate dielectric layer 23 may be interposed between the first test transfer gate electrode 141 and the first test channel CH1t and between the second test transfer gate electrode 142 and the second test channel CH2t.

The first insulating layer 63 may cover the upper surface of the substrate 11. The first insulating layer 63 may cover the isolation layer 21, the first test photodiode 131, the second test photodiode 132, the first test transfer gate electrode 141, the second test transfer gate electrode 142 and the test floating diffusion 147.

The first contact plug 151 may be formed on the first test photodiode 131, the second contact plug 152 may be formed on the second test photodiode 132, and the fifth contact plug 157 may be formed on the test floating diffusion 147. The first contact plug 151 may be connected to the first test photodiode 131 through the first insulating layer 63. The second contact plug 152 may be connected to the second test photodiode 132 through the first insulating layer 63. The fifth contact plug 157 may be connected to the test floating diffusion 147 through the first insulating layer 63.

In an embodiment, the color filter layer 72 and the microlens layer 75 may be formed on the rear surface of the substrate 11 in the test pattern region 17.

Referring to FIG. 5, each of the first photodiode 31, the second photodiode 32, the first test photodiode 131, and the second test photodiode 132 may include first and second impurity regions 25 and 27. The first impurity region 25 may include N-type impurities. The second impurity region 27 may include P-type impurities. The second impurity region 27 may be formed between the first impurity region 25 and the first insulating layer 63. The second impurity region 27 may be directly contacted with the first impurity region 25. Each of the first and second contact plugs 151 and 152 may directly contact the first impurity region 25 through the first insulating layer 63 and the second impurity region 27. The fifth contact plug 157 may directly contact the test floating diffusion 147 through the first insulating layer 63.

In the active pixel region 15, the color filter layer 72 may be formed on the first insulating layer 63. The microlens layer 75 may be formed on the color filter layer 72. In the test pattern region 17, the color filter layer 72, the microlens layer 75 and the third insulating layer 79 may be omitted. The first contact plug 151, the second contact plug 152, and the fifth contact plug 157 may be exposed on the first insulating layer 63.

Hereafter, a method for correcting an offset between pixels in an image sensor having the above-described structure using the test pattern region will be described in detail.

Figure 6:
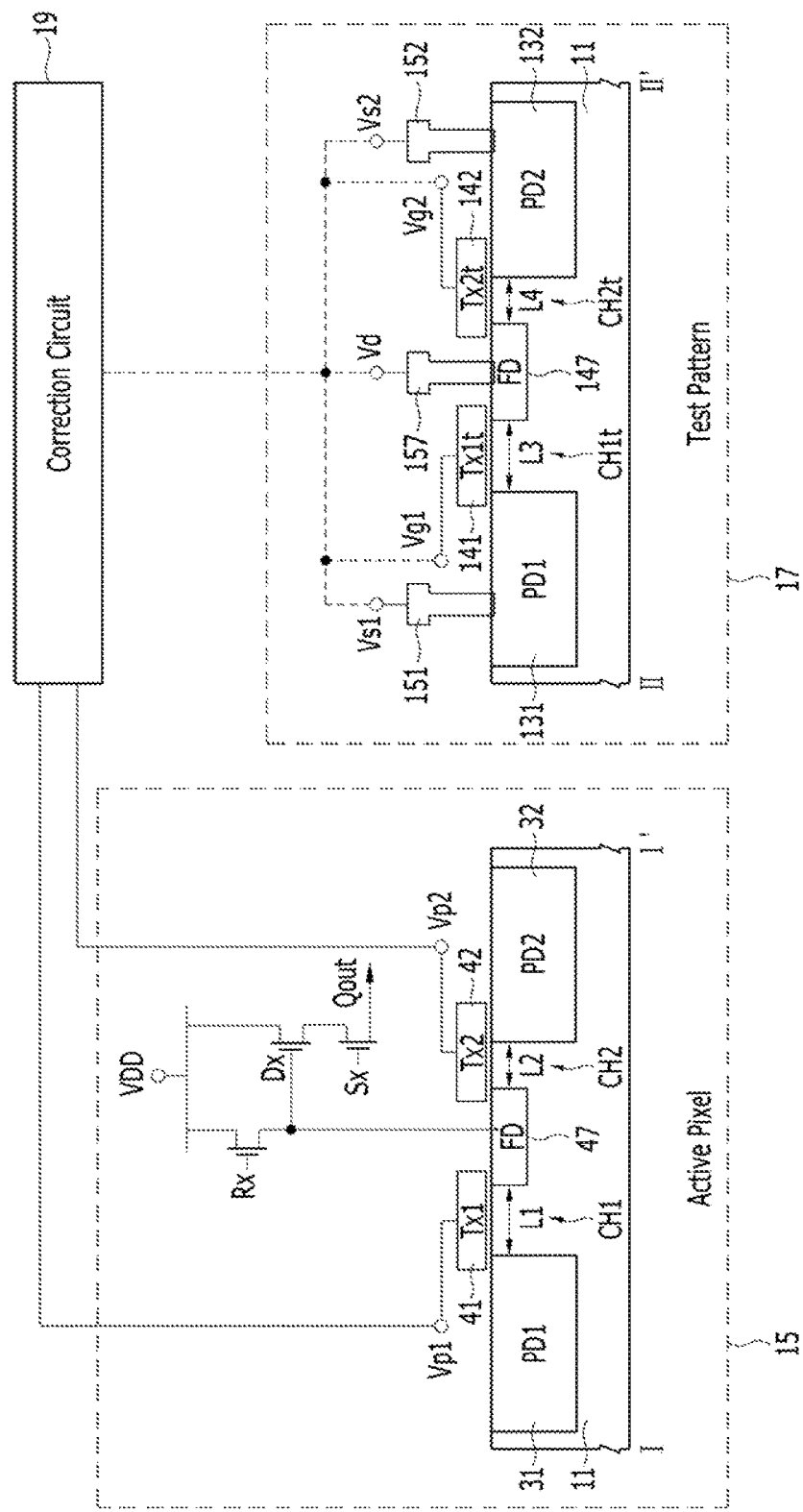
FIGS. 6 and 7 are cross-sectional views for describing the main components of the image sensor in accordance with the embodiment.
Figure 7:
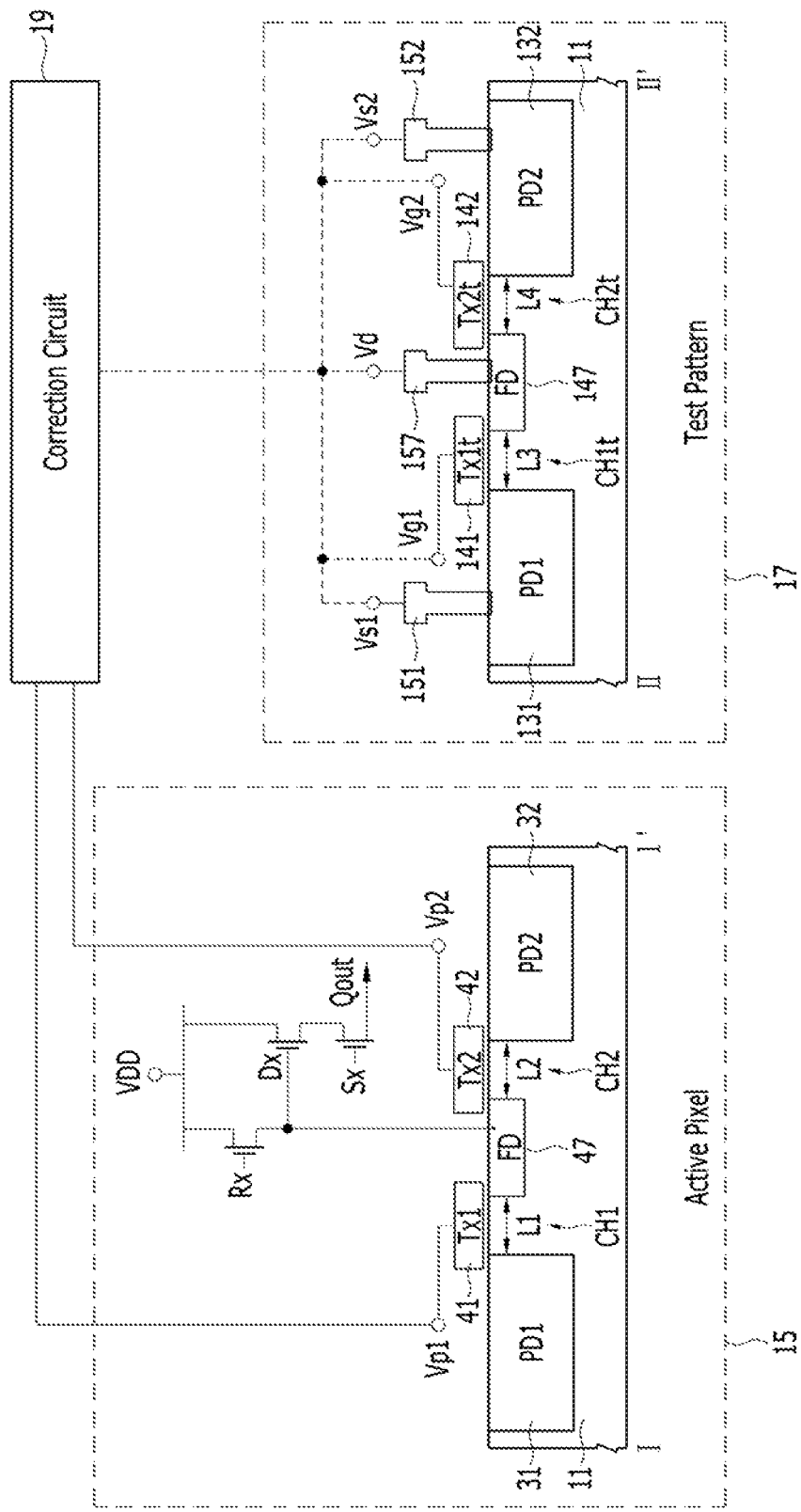

FIGS. 6 and 7 are cross-sectional views illustrating main components for describing the method for correcting an offset between pixels in the image sensor in accordance with the embodiment. FIGS. 6 and 7 are cross-sectional views taken along the lines I-I' and II-II' of FIG. 3. Referring to FIG. 6, the image sensor in accordance with the present embodiment may include the active pixel region 15, the test pattern region 17, and the correction circuit 19. The correction circuit 19 may be referred to as a transfer transistor correction circuit.

The active pixel region 15 may include the substrate 11, the first photodiode 31, the second photodiode 32, the first transfer gate electrode 41, the second transfer gate electrode 42, the floating diffusion 47, a reset transistor Rx, a drive transistor Dx, and a select transistor Sx. In the substrate 11, the first channel CH1 and the second channel CH2 may be defined by the first transfer gate electrode 41 and the second transfer gate electrode 42, respectively. The first channel CH1 may be formed between the first photodiode 31 and the floating diffusion 47 and under the first transfer gate electrode 41, and have the first length L1. The second channel CH2 may be formed between the second photodiode 32 and the floating diffusion 47 and under the second transfer gate electrode 42, and have the second length L2. The first transfer gate electrode 41 and the first channel CH1 may constitute the first transfer transistor Tx1. The second transfer gate electrode 42 and the second channel CH2 may constitute a second transfer transistor Tx2.

The test pattern region 17 may include the substrate 11, the first test photodiode 131, the second test photodiode 132, the first test transfer gate electrode 141, the second test transfer gate electrode 142, the test floating diffusion 147, the first contact plug 151, the second contact plug 152 and the fifth contact plug 157. In the substrate 11, the first test channel CH1t and the second test channel CH2t may be defined by the first test transfer gate electrode 141 and the second test transfer gate electrode 142, respectively.

The first test channel CH1t may be formed between the first test photodiode 131 and the test floating diffusion 147 and under the first test transfer gate electrode 141, and have the third length L3. The second test channel CH2t may be formed between the second test photodiode 132 and the test floating diffusion 147 and under the second test transfer gate electrode 142, and have the fourth length L4. The first test transfer gate electrode 141 and the first test channel CH1t may constitute a first test transfer transistor Tx1t. The second test transfer gate electrode 142 and the second test channel CH2t may constitute a second test transfer transistor Tx2t.

The floating diffusion 47 may be formed between the first and second photodiodes 31 and 32. That is, the first and second photodiodes 31 and 32 may share the floating diffusion 47. The first channel CH1 may be defined between the floating diffusion 47 and the first photodiode 31. The second channel CH2 may be defined between the floating diffusion 47 and the second photodiode 32. The first transfer gate electrode 41 may be formed over the first channel CH1. The second transfer gate electrode 42 may be formed over the second channel CH2. Each of the first and second transfer gate electrodes 41 and 42 may be connected to the correction circuit 19.

The first test photodiode 131, the second test photodiode 132, the first test transfer gate electrode 141, the second test transfer gate electrode 142, the test floating diffusion 147, the first test channel CH1t and the second test channel CH2t may be formed substantially at the same time as the first photodiode 31, the second photodiode 32, the first transfer gate electrode 41, the second transfer gate electrode 42, the floating diffusion 47, the first channel CH1 and the second channel CH2, and include substantially the same materials and structures as the first photodiode 31, the second photodiode 32, the first transfer gate electrode 41, the second transfer gate electrode 42, the floating diffusion 47, the first channel CH1 and the second channel CH2, respectively. That is, the pixels of the test pattern region 17 may have the same offsets as the transfer transistors included in the respective pixels of the active pixel region 15.

The first test photodiode 131, the second test photodiode 132, the first test transfer gate electrode 141, the second test transfer gate electrode 142, the test floating diffusion 147, the first test channel CH1t and the second test channel CH2t may be misaligned to substantially the same degree as the first photodiode 31, the second photodiode 32, the first transfer gate electrode 41, the second transfer gate electrode 42, the floating diffusion 47, the first channel CH1 and the second channel CH2, respectively. The second length L2 of the second channel CH2 may be smaller than the first length L1 of the first channel CH1. The third length L3 of the first test channel CH1t may be substantially equal to the first length L1, and the fourth length L4 of the second test channel CH2t may be substantially equal to the second length L2. That is, the first test transfer transistor Tx1t may have substantially the same offset as the first transfer transistor Tx1, and the second test transfer transistor Tx2 may have substantially the same offset as the second transfer transistor Tx2.

The electrical characteristic of the first test transfer transistor Tx1t may be measured by applying a first source bias Vs1 to the first contact plug 151, applying a drain bias Vd to the fifth contact plug 157, and applying a first gate bias Vg1 to the first test transfer gate electrode 141. The electrical characteristic of the second test transfer transistor Tx2t may be measured by applying a second source bias Vs2 to the second contact plug 152, applying the drain bias Vd to the fifth contact plug 157, and applying a second gate bias Vg1 to the second test transfer gate electrode 142.

The first test transfer transistor Tx1t including the first test transfer gate electrode 141 and the first test channel CH1t may have substantially the same electrical characteristics as the first transfer transistor Tx1 including the first transfer gate electrode 41 and the first channel CH1. The second test transfer transistor Tx2t including the second test transfer gate electrode 142 and the second test channel CH2t may have substantially the same electrical characteristic as the second transfer transistor Tx2 including the second transfer gate electrode 42 and the second channel CH2.

Based on the electrical characteristics measured in the first and second test transfer transistors Tx1t and Tx2t, a first correction bias Vp1 for the first transfer gate electrode 41 and a second correction bias Vp2 for the second transfer gate electrode 42 may be calculated. The electrical characteristics of the first test transfer transistor Tx1t, the electrical characteristics of the second test transfer transistor Tx2t, the first correction bias Vp1, the second correction bias Vp2, or a combination thereof may be written to the correction circuit 19. The correction circuit 19 may include a nonvolatile memory such as One Time Programmable (OTP) memory. The correction circuit 19 may be connected to the first and second transfer gate electrodes 41 and 42. The correction circuit 19 may serve to apply the first correction bias Vp1 to the first transfer gate electrode 41, and apply the second correction bias Vp2 to the second transfer gate electrode 42.

In an embodiment, the first contact plug 151, the second contact plug 152 and the fifth contact plug 157 may correspond to conceptual elements for describing lines capable of applying power for checking the electrical characteristics of the test transfer transistors Tx1t and Tx2t.

In accordance with the present embodiment, the electrical characteristics of the first and second transfer transistors Tx1 and Tx2 can be optimized and make it possible to implement an image sensor having excellent electrical characteristics. Specifically, variations of the transfer transistors Tx1 and Tx2 formed in the active pixel region 15 can be corrected through the test transfer transistors which are formed in the test pattern region 17 to correspond to the transfer transistors. Thus, it is possible to prevent characteristic degradation which may occur due to the variations of the transfer transistors, for example, an image lag.

Referring to FIG. 7, the second length L2 of the second channel CH2 may be substantially equal to the first length L1 of the first channel CH1. The third length L3 of the first test channel CH1t may be substantially equal to the first length L1, and the fourth length L4 of the second test channel CH2t may be substantially equal to the second length L2.

Figure 8:
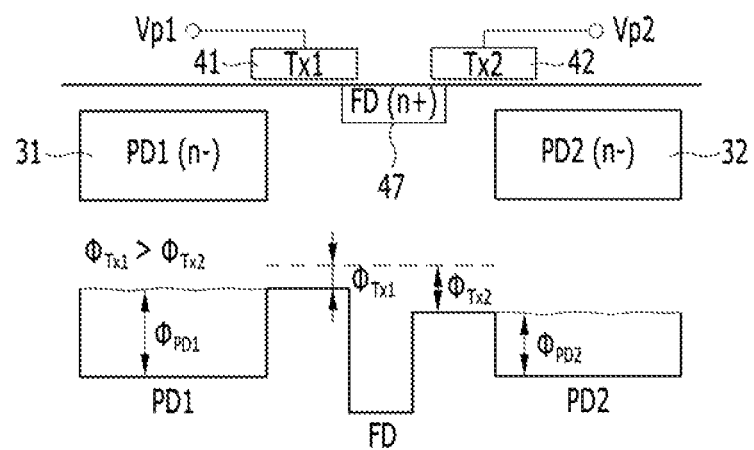
FIG. 8 is a potential distribution diagram of a transfer transistor in accordance with the present embodiment.

FIG. 8 is a potential distribution diagram for describing the operation of the transfer transistor in accordance with the present embodiment. In FIG. 8, 'Φ' represents a potential barrier. Referring to FIG. 8, photocharges generated in response to incident light, that is, electrons may be accumulated in the photodiodes 31 and 32.

While the first transfer transistor Tx1 has a low surface potential, the first transfer transistor Tx1 may have a high potential barrier $\Phi_{Tx1}$. Thus, it is possible to prevent the electrons stored in the first photodiode 31 from migrating to adjacent pixels during an integration time in which the first photodiode 31 generates photocharges in response to incident light, thereby securing sufficient capacitance. That is, a large number of electrons may be stored in the first photodiode 31.

However, when the photocharges generated by the first photodiode 31 are transferred to the floating diffusion 47 in response to a signal applied to the first transfer transistor Tx1, all of the electrons accumulated in the first photodiode 31 may not be transferred to the floating diffusion 47 due to the high potential barrier $\Phi_{Tx1}$ of the first transfer transistor Tx1. In this case, image lag may occur. When the threshold voltage of the first transfer transistor Tx1 is lowered, the potential barrier $\Phi_{Tx1}$ may be lowered. Then, all of the electrons accumulated in the first photodiode 31 may migrate to the floating diffusion 47, which makes it possible to prevent the occurrence of image lag.

While the second transfer transistor Tx2 has a high surface potential, the second transfer transistor Tx2 may have a low potential barrier $\Phi_{Tx2}$. When the second transfer transistor Tx2 has a low potential barrier $\Phi_{Tx2}$, the electrons accumulated in the second photodiode 32 may easily migrate to the floating diffusion 47, but the capacitance of the second photodiode 32 may be reduced. Then, a sufficient number of electrons cannot be accumulated in the second photodiode 32 during the integration time. When the threshold voltage of the second transfer transistor Tx2 is raised, the potential barrier $\Phi_{Tx2}$ may be raised to accumulate a larger number of electrons in the second photodiode 32 during the integration time.

Each of the transfer transistors Tx1 and Tx2 may include a variation caused by an error of the fabrication process. Thus, the transfer transistors Tx1 and Tx2 may have different surface potentials. Therefore, only globally controlling the biases applied to the transfer transistors Tx1 and Tx2 has a limitation in optimizing the performance of the transfer transistors Tx1 and Tx2.

In accordance with the present embodiment, however, the first correction bias Vp1 for the first transfer gate electrode 41 and the second correction bias Vp2 for the second transfer gate electrode 42 may be applied to optimize the performances of the transfer transistors Tx1 and Tx2. The correction biases Vp1 and Vp2 may be calculated based on the electrical characteristics of the test transfer transistors Tx1t and Tx2t. Through the correction biases Vp1 and Vp2, the performance of the transfer transistors Tx1 and Tx2 having different potentials can be optimized.

Figure 9:
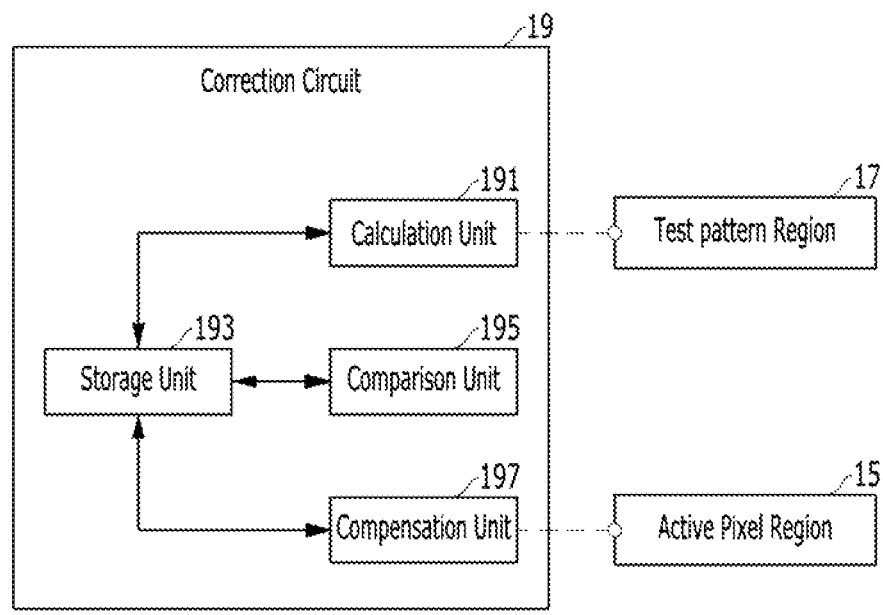
FIG. 9 is a block diagram illustrating a correction circuit in accordance with an embodiment.
Figure 10:
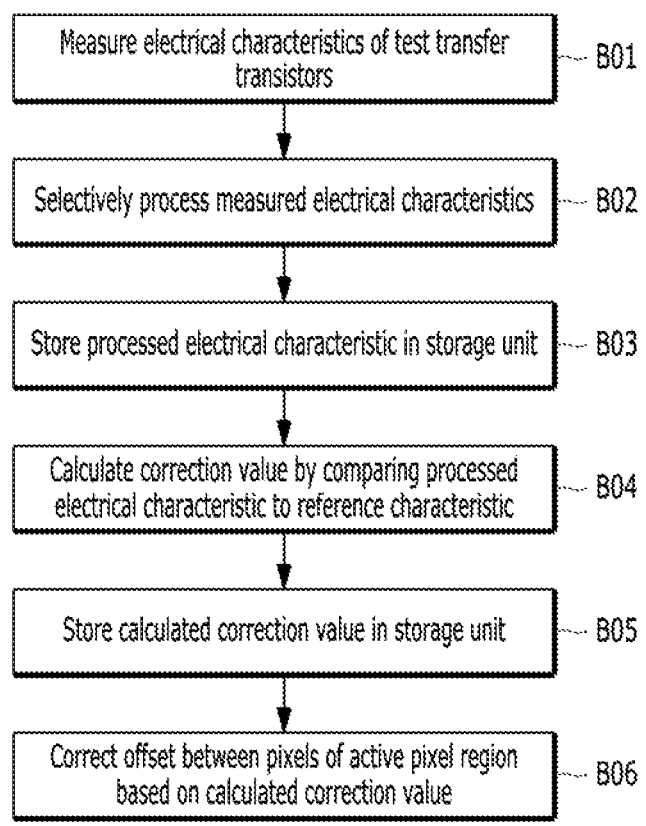
FIG. 10 is a flowchart for describing an offset correction method of an image sensor in accordance with an embodiment.

FIG. 9 is a block diagram illustrating a correction circuit in accordance with the present embodiment. FIG. 10 is a flowchart for describing an offset correction method of an image sensor in accordance with an embodiment. Referring to FIG. 9, the correction circuit 19 in accordance with the present embodiment may include a calculation unit 191, a storage unit 193, a comparison unit 195 and a compensation unit 197.

The calculation unit 191 may statistically process the electrical characteristics of the test transfer transistors Tx1t and Tx2t in the test pattern region 17. For example, unit pixel groups, in each of which four pixels or photodiodes share one floating diffusion FD, are two-dimensionally arranged in the test pattern region 17. The calculation unit 191 may measure the electrical characteristics of the first test transfer transistors in the respective unit pixel groups, for example, the threshold voltages, and calculate an average threshold voltage of the first test transfer transistors.

Referring to FIG. 3, the first test transfer transistor may correspond to the test transfer transistor which is formed at the left top in each of the unit pixel groups. That is, the first test transfer transistor may correspond to the first test transfer transistor Tx1t. The electrical characteristics of the first test transfer transistors, which are measured in the unit pixel groups of the test pattern region 17, may be used as data to compensate for offsets of the first transfer transistors of the unit pixel groups in the active pixel region 15, which have substantially the same characteristics. Referring to FIG. 3, the first transfer transistor may correspond to a transfer transistor which is formed at the left top in each of the unit pixel groups. That is, the first transfer transistor may correspond to the first transfer transistor Tx1. The calculation unit 191 may be connected to the storage unit 193.

The storage unit 193 may serve to store the electrical characteristics of the test transfer transistors Tx1t and Tx2t, the correction biases Vp1 and Vp2 calculated by the comparison unit 195 based on the electrical characteristics, or both. The storage unit 193 may include a nonvolatile memory such as OTP memory.

The comparison unit 195 may be connected between the storage unit 193 and the compensation unit 197. The comparison unit 195 may calculate the correction biases Vp1 and Vp2 by comparing the electrical characteristic data measured and processed by the calculation unit 191 with a preset reference bias. For example, the correction voltages Vp1 and Vp2 may be obtained by comparing the average threshold voltages of the test transfer transistors Tx1t and Tx2t of the test pattern region 17 with a reference voltage preset to drive the transfer transistors Tx1 and Tx2 of the active pixel region 15. The average threshold voltages of the test transfer transistors Tx1t and Tx2t of the test pattern region 17 may be calculated through the calculation unit 191.

The compensation unit 197 may be connected to the storage unit 193 and provides the correction biases Vp1 and Vp2 to the transfer gate electrodes 41 and 42 in the active pixel region 15.

In an embodiment, the correction circuit 19 may include the storage unit 193, the comparison unit 195 and the compensation unit 197 and may not include the calculation unit 191. In another embodiment, the correction circuit 19 may include the storage unit 193 and the compensation unit 197 and may not include the comparison unit 195.

Referring to FIG. 10, the offset correction method of the image sensor may include measuring electrical characteristics of test transfer transistors at step B01, selectively processing the measured electrical characteristics at step B02, calculating a correction value by comparing the processed electrical characteristics with a reference characteristic at step B04, and correcting an offset between pixels in the active pixel region based on the calculated correction value at step B06. In an embodiment, each of the active pixel region 15 and the test pattern region 17 includes a plurality of unit pixel groups arranged in a two-dimensional manner, and the plurality of unit pixel groups each including four pixels sharing one floating diffusion FD.

Electrical characteristics of the test transfer transistors Tx1t and Tx2t may be measured in each of the unit pixel groups of the test pattern region 17 at step B01. For example, the threshold voltages of the test transfer transistors Tx1t and Tx2t may be measured in each of the unit pixel groups. Specifically, referring to FIGS. 6 and 7, the electrical characteristics of the test transfer transistors Tx1t and Tx2t may be measured by applying a first source voltage Vs1 to the first contact plug 151, applying a second source voltage Vs2 to the second contact plug 152, applying a drain voltage Vd to the fifth contact plug 157, applying a first gate voltage Vg1 to the first test transfer gate electrode 141, and applying a second gate voltage Vg2 to the second test transfer gate electrode 142 at a fab-out step or wafer level probe test step of the substrate 11.

Then, the electrical characteristics measured by the calculation unit 191 may be selectively processed at step B02. Specifically, the measured data of the test transfer transistors formed at the same positions in the respective unit pixel groups of the test pattern region 17 may be extracted and processed. For example, all of the threshold voltages of the test transfer transistors Tx1t positioned at the left tops of the respective unit pixel groups may be added up to calculate an average thereof.

The above-described process may be repeated to calculate the average threshold voltages of the test transfer transistors positioned at the left bottoms, the right tops, and the right bottoms of the respective unit pixel groups. The processed electrical characteristics may be used as data to compensate for the offsets of the transfer transistors which are positioned at the same positions in the respective unit pixel groups of the active pixel region 15 and have substantially the same characteristics. The electrical characteristics processed by the calculation unit 191 may be stored in the storage unit 193 at step B03.

Then, the comparison unit 195 may calculate a correction value by comparing the processed electrical characteristic with a reference characteristic at step B04, and the compensation unit 197 may compensate for an offset between pixels of the active pixel region 15 based on the correction value calculated by the comparison unit at step B06. The correction value calculated by the comparison unit 195 may be stored in the storage unit 193 at step B05.

For example, the processed electrical characteristic may correspond to an average threshold voltage value, and the reference characteristic may correspond to threshold voltages of the transfer transistors Tx1 and Tx2 of the active pixel region 15. The correction value may include the correction biases Vp1 and Vp2 obtained by reflecting the average threshold voltage into the reference voltages which are preset to drive the transfer transistors Tx1 and Tx2 of the active pixel region 15. Specifically, the average threshold voltage, which is measured and processed from the test transfer transistors Tx1t positioned at the left tops in the respective unit pixel groups of the test pattern region 17, may be compared with the threshold voltage value of the transfer transistors Tx1 positioned at the left tops in the respective unit pixel groups of the active pixel region 15.

When the average threshold voltage is larger than the threshold voltage value which is preset, it may indicate that the actual threshold voltages of the transfer transistors Tx1 positioned at the left tops in the respective unit pixel groups of the active pixel region 15 are larger than the preset threshold voltage due to an error in process. Thus, during an actual operation, the offset may be compensated for by supplying a bias larger than the reference bias to the transfer transistors Tx1 positioned at the left tops in the respective unit pixel groups of the active pixel region 15. For example, referring to FIGS. 6 and 7, the first correction bias Vp1 may be the first reference voltage for turning on first transfer transistor Tx1+0.2V.

Furthermore, the average threshold voltage measured and processed using the test transfer transistors Tx2t, which are positioned at the right bottoms in the respective unit pixel groups of the test pattern region 17, may be compared with a preset threshold voltage value of the transfer transistors Tx2, which are positioned at the right bottoms in the respective unit pixel groups of the active pixel region 15.

When the average threshold voltage is smaller than the preset threshold voltage value, it may indicate that the actual threshold voltages of the transfer transistors Tx2, which are positioned at the right bottoms in the respective unit pixel groups of the active pixel region 15, are smaller than the preset threshold voltage due to an error in process. Thus, during an actual operation, the offset may be compensated for by supplying a bias smaller than the reference bias to the transfer transistors Tx2, which are positioned at the right bottoms in the respective unit pixel groups of the active pixel region 15. For example, referring to FIGS. 6 and 7, the second correction bias Vp2 may be the second reference voltage for turning off second transfer transistor Tx2−0.1V.

In accordance with the present embodiments, the image sensor may include the active pixel region and the test pattern region which include pixels having substantially the same characteristics as pixels formed in the active pixel region, and effectively correct an offset between pixels in the active pixel region using electrical characteristics measured using the test pattern region.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a substrate including an active pixel and a test pattern,
   wherein the test pattern is located adjacent to the active pixel,
   wherein the active pixel comprises a first photodiode, a floating diffusion, a first channel provided between the first photodiode and the floating diffusion, and a first transfer gate electrode provided over the first channel,
   wherein the test pattern comprises a first test photodiode, a test floating diffusion, a second channel provided between the first test photodiode and the test floating diffusion, a first test transfer gate electrode provided over the second channel, and a first contact plug connected to the first test photodiode, and
   wherein the first test photodiode, the test floating diffusion, the second channel, and the first test transfer gate have substantially the same alignment errors as the first photodiode, the floating diffusion, the first channel, and the first transfer gate electrode, respectively.

2. The image sensor of claim 1, further comprising:
   a logic circuit adjacent to the active pixel; and
   a correction circuit formed in the logic circuit,
   wherein the correction circuit is connected to the first transfer gate electrode.

3. The image sensor of claim 2, wherein the test pattern is formed between the logic circuit and the active pixel.

4. The image sensor of claim 2, wherein the test pattern is connected to a side surface of the active pixel.

5. The image sensor of claim 2,
   wherein the first test photodiode, the test floating diffusion, the second channel, and the first test transfer gate electrode, in combination, form a test transfer transistor,
   wherein the correction circuit comprises a storage unit and a compensation unit,
   wherein the storage unit stores an electrical characteristic of the test transfer transistor, a correction bias calculated based on the electrical characteristic, or both; and
   wherein the compensation unit is connected to the storage unit and provides the correction bias to the first transfer gate electrode.

6. The image sensor of claim 5, wherein the correction circuit further comprises:
   a calculation unit connected to the storage unit and processing the electrical characteristic of the test transfer transistor.

7. The image sensor of claim 5, wherein the correction circuit further comprises:
   a comparison unit connected between the storage unit and the compensation unit and calculates the correction bias by comparing the electrical characteristic with a reference bias.

8. The image sensor of claim 5, wherein the storage unit comprises a nonvolatile memory.

9. The image sensor of claim 1,
   wherein the active pixel further comprises a second photodiode, a third channel provided between the second photodiode and the floating diffusion, and a second transfer gate electrode provided over the third channel,
   wherein the floating diffusion is arranged between the first photodiode and the second photodiode,
   wherein the test pattern region further comprises a second test photodiode, a fourth channel provided between the second test photodiode and the test floating diffusion, a second test transfer gate electrode provided over the fourth channel, and a second contact plug connected to the second test photodiode,
   wherein the test floating diffusion is arranged between the first test photodiode and the second test photodiode, and
   wherein the second test photodiode, the fourth channel, and the second test transfer gate electrode have substantially the same alignment errors as the second photodiode, the third channel, and the second transfer gate electrode, respectively.

10. The image sensor of claim 9,
    wherein the first channel has a first length, the second channel has a second length, the third channel has a third length, and the fourth channel has a fourth length,
    wherein the second length of the second channel is substantially equal to the first length of the first channel, and
    wherein the fourth length of the fourth channel is substantially equal to the third length of the third channel.

11. The image sensor of claim 10, wherein the third length of the third channel is smaller than the first length of the first channel.

12. The image sensor of claim 9, further comprising:
    a third contact plug connected to the test floating diffusion.

13. The image sensor of claim 9,
wherein the first test photodiode, the second test photodiode, the test floating diffusion, the second channel, the fourth channel, the first test transfer gate electrode, and the second test transfer gate electrode comprise the same materials as the first photodiode, the second photodiode, the floating diffusion, the first channel, the third channel, the first transfer gate electrode, and the second transfer gate electrode, respectively.

14. The image sensor of claim 1, further comprising:
a color filter layer over the first photodiode; and
a microlens layer over the color filter layer.

15. An offset correction method of an image sensor having an active pixel region and a test pattern region, each of which includes a plurality of unit pixel groups arranged in a two-dimensional manner, the unit pixel groups each including a plurality of pixels sharing one floating diffusion, the offset correction method comprising:
   measuring electrical characteristics of test transfer transistors in the test pattern region;
   processing electrical characteristics of test transfer transistors formed at first positions in the unit pixel groups of the test pattern region;
   calculating correction values by comparing the processed electrical characteristics to reference characteristics of transfer transistors formed at second positions in the unit pixel groups of the active pixel region; and
   correcting offsets for the transfer transistors formed at the second positions in the unit pixel groups of the active pixel region based on the calculated correction value,
   wherein the active pixel region comprises a first channel between a first photodiode and a floating diffusion and a first transfer gate electrode over the first channel,
   the test pattern region comprises a second channel between a first test photodiode and a test floating diffusion, a first test transfer gate electrode over the second channel, and a first contact plug connected to the first test photodiode, and
   the first test photodiode, the test floating diffusion, the second channel and the first test transfer gate electrode have substantially the same alignment errors as the first photodiode, the floating diffusion, the first channel and the first transfer gate electrodes.

16. The offset correction method of claim 15, wherein the first position and the second position in each of the unit pixel groups are the same positions.

* * * * *